United States Patent
Wrobel

(10) Patent No.: US 11,758,661 B2
(45) Date of Patent: Sep. 12, 2023

(54) LOCKING INPUT/OUTPUT MODULE

(71) Applicant: Rockwell Automation Technologies, Inc., Mayfield Heights, OH (US)

(72) Inventor: Adam M. Wrobel, Gates Mills, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 163 days.

(21) Appl. No.: 17/179,995

(22) Filed: Feb. 19, 2021

(65) Prior Publication Data

US 2022/0272841 A1    Aug. 25, 2022

(51) Int. Cl.
*H05K 5/02* (2006.01)
*H05K 1/14* (2006.01)

(52) U.S. Cl.
CPC ............. *H05K 1/14* (2013.01); *H05K 5/0221* (2013.01); *H05K 2201/1053* (2013.01)

(58) Field of Classification Search
CPC ................... H05K 1/14; H05K 5/0221; H05K 2201/1053; H05K 7/1474; H05K 5/026; Y02P 90/02; G06F 1/186; G05B 19/0423
See application file for complete search history.

(56) References Cited

U.S. PATENT DOCUMENTS

| | | |
|---|---|---|
| 6,208,527 B1 | 3/2001 | McMahon et al. |
| 6,425,770 B1 | 7/2002 | Lostoski et al. |
| 8,708,595 B2 * | 4/2014 | Tseng ......................... F16B 5/10 403/325 |
| 9,325,110 B2 | 4/2016 | Lostoski et al. |
| 9,362,685 B2 | 6/2016 | Lostoski et al. |
| 9,485,879 B2 | 11/2016 | Molnar et al. |
| 10,483,663 B2 | 11/2019 | Wrobel et al. |
| 2007/0108877 A1 | 5/2007 | Bergmann et al. |
| 2014/0064837 A1 | 3/2014 | Tseng |
| 2021/0100124 A1 | 4/2021 | Wrobel et al. |

OTHER PUBLICATIONS

Extended Search Report, dated Jul. 14, 2022, in connection with European Application No. 22154272.3.

* cited by examiner

*Primary Examiner* — Anthony Q Edwards
*Assistant Examiner* — Hung Q Dang
(74) *Attorney, Agent, or Firm* — Lippes Mathias LLP

(57) ABSTRACT

An I/O system including an I/O base having a first connector component, an I/O module selectively attachable to the I/O base and having a second connector component adapted to mate with the first connector component, and a locking actuator assembly for securing the I/O module to the I/O base. The locking actuator assembly includes an actuator supported for axial and rotational movement by the I/O module, the actuator movable from an unlocked position having a first end of the actuator extending from a housing of the I/O module to a locked position wherein a second end of the actuator extends from the housing. The second end of the actuator includes a flange adapted to pass through a corresponding slot in a surface of the I/O base such that when the actuator is rotated the at least one flange restricts withdrawal of the actuator from the slot in the I/O base.

13 Claims, 9 Drawing Sheets

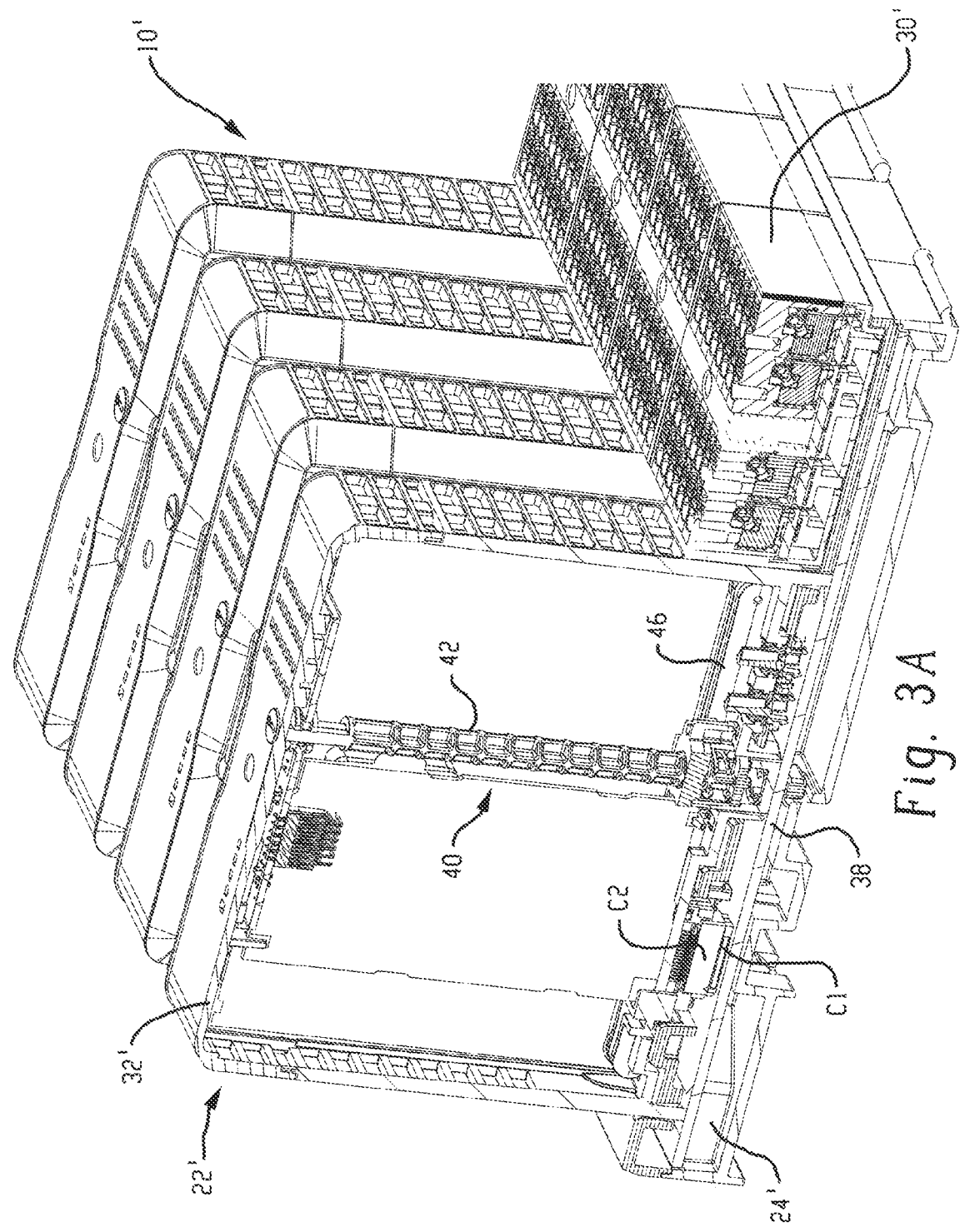

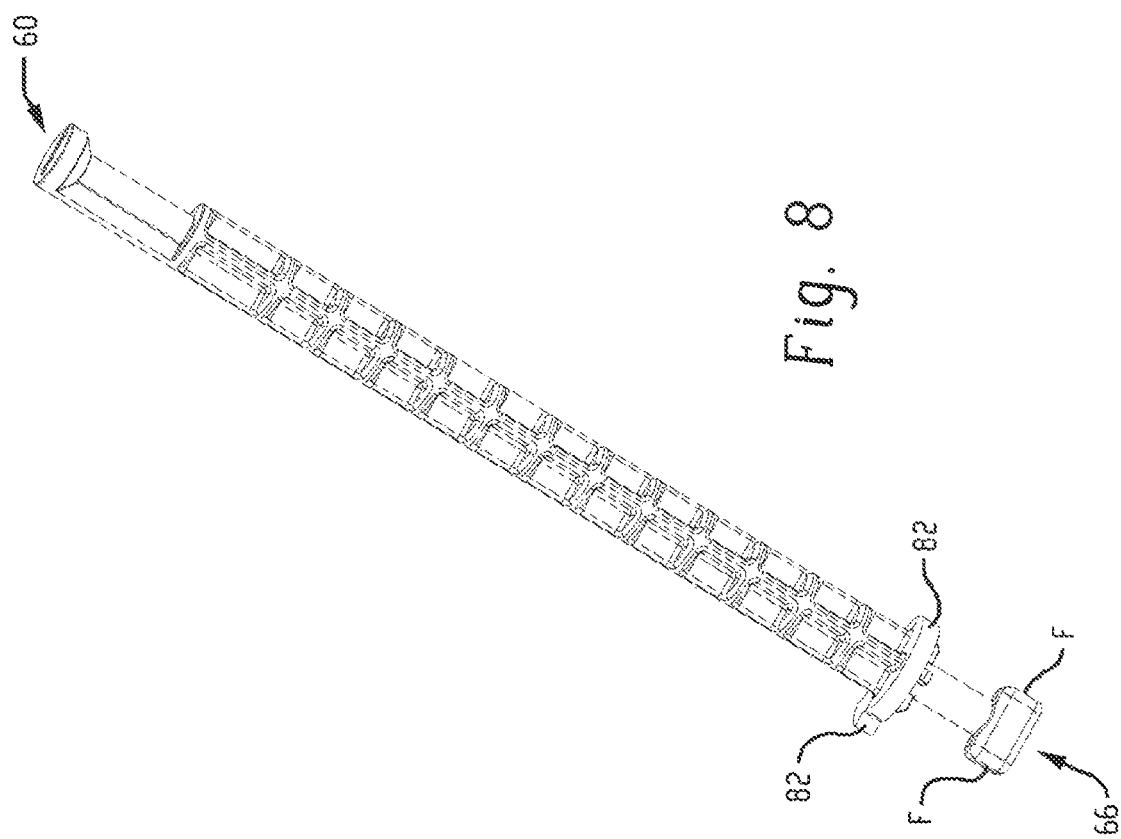
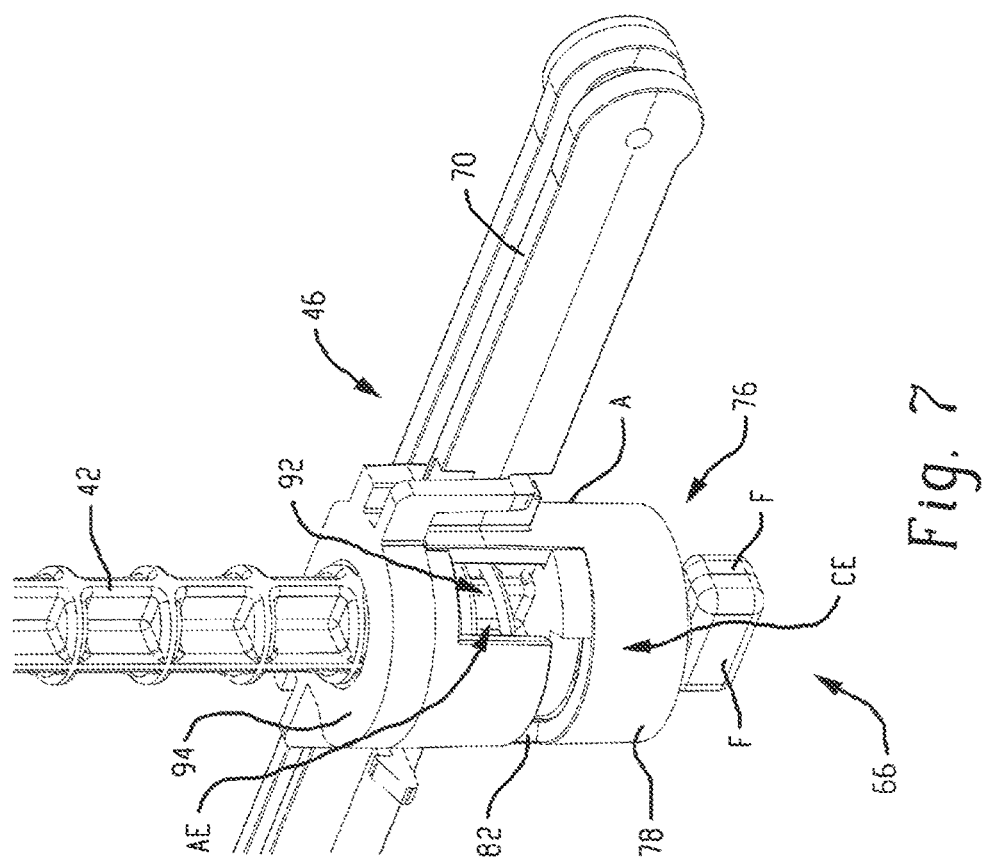

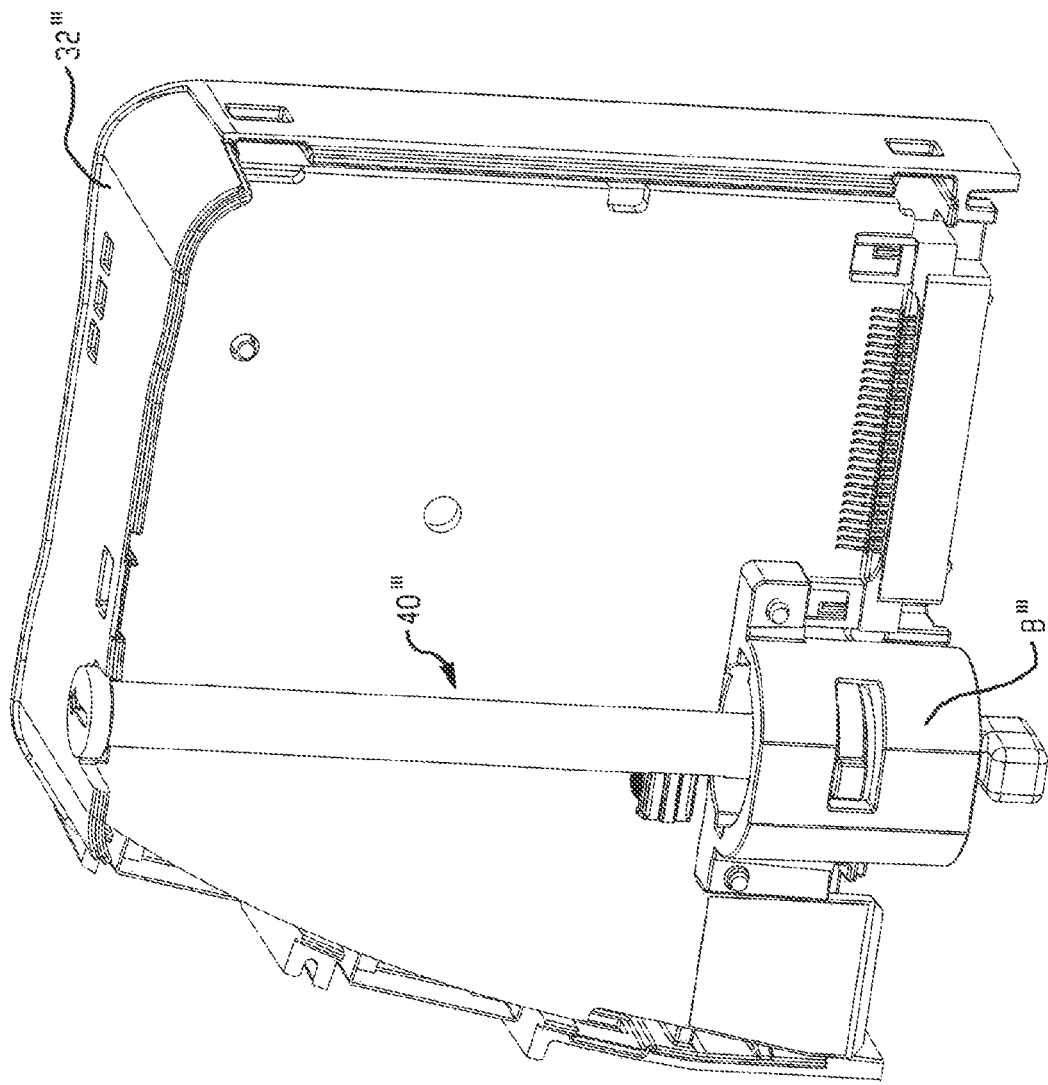

LOCKING INPUT/OUTPUT MODULE

BACKGROUND INFORMATION

The subject matter disclosed herein relates to the field of automation control systems, such as those used in industrial and commercial settings. More particularly, embodiments of the present invention relate to techniques for providing, accessing, configuring, operating, or interfacing with input/output (I/O) devices that are configured for coupling and interaction with an automation controller.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar, communication bus, or the like, a terminal block for communicatively coupling the I/O device with field devices, and an I/O module that includes circuitry for performing communication functions and/or logic operations. In traditional automation control systems, the I/O module may be coupled to the base by pushing the module toward the base. Friction or a simple locking mechanism between parts of the I/O module and the base may help prevent the I/O module from disengaging from the base. In the past, locking toggle mechanisms have been employed to secure an I/O module to a base. In other arrangements, screws or other fasteners are used to secure an I/O module to a base. The I/O module may be removed from the base by pulling the I/O module away from the base.

BRIEF DESCRIPTION

It is now recognized that it is desirable to provide more efficient and effective techniques for coupling, locking, and uncoupling I/O modules from bases of I/O devices. In accordance with one aspect of the present disclosure, an I/O system comprises an I/O base having a first connector component, an I/O module selectively attachable to the I/O base and having a second connector component adapted to mate with the first connector component, and a locking actuator assembly for securing the I/O module to the I/O base. The locking actuator assembly includes an actuator supported for axial and rotational movement by the I/O module, the actuator movable from an unlocked position having a first end of the actuator extending from a housing of the I/O module to a locked position wherein a second end of the actuator extends from the housing, the second end of the actuator including at least one flange adapted to pass through a corresponding slot/opening in a surface of the I/O base such that when the actuator is rotated the at least one flange restricts withdrawal of the actuator from the slot/opening in the I/O base.

The second connector component can be supported by a circuit board within the housing, and the actuator can be supported by a bracket secured to the circuit board adjacent the second connector component. The bracket can include a support having first and second ends secured to the circuit board at outboard locations of the circuit board such that a major portion of a width of the circuit board is bridged by the support. The support can include a cylindrical portion between its first and second ends through which the actuator extends. The assembly can further include a cap secured to the support, the cylindrical portion of the support and the cap defining a cavity in which at least one radially extending guide flange of the actuator is received. The cap and the cylindrical portion can define at least one slot in which the at least one guide flange is received, the at least one slot delimiting axial and rotational movement of the actuator. The at least one slot can be L-shape, having a first portion of the L-shape extending axially and a second portion of the L-shape extending circumferentially. A biasing element can be interposed between the at least one guide flange and the cylindrical portion of the support, the biasing element urging the actuator axially towards to unlocked position. The first end of the actuator can extend from a first exterior side of the housing of the I/O device when in the unlocked position, and wherein the second end of the actuator extends from a second exterior side of the housing opposite the first exterior side when in the locked position. The support can be secured to the circuit board adjacent the second exterior side of the housing.

In accordance with another aspect, a locking actuator assembly for selectively securing together associated first and second devices of an associated I/O system comprises a locking actuator assembly including an actuator supported for axial and rotational movement by a circuit board of the associated first device, the actuator movable from an unlocked position to a locked position upon axial depression and rotation of a first end of the actuator, wherein a second end of the actuator includes at least one flange adapted to pass through a corresponding slot/opening in a surface of the associated second device such that when the actuator is rotated the at least one flange restricts withdrawal of the actuator from the slot/opening in the surface of the associated second device.

The circuit board can support a first connector component adapted to mate with a second connector component of the associated second device, and the actuator can be supported by a bracket secured to the circuit board adjacent the connector component. The actuator can be supported by the support at a location between first and second ends of the support, the first and second ends of the support being secured to the circuit board at outboard locations thereof such that a major portion of a width of the circuit board is bridged by the support. A cylindrical portion of the bracket and a cap secured to the bracket define a cavity in which a radially extending guide flange of the actuator is received. The cap and the cylindrical portion define at least one slot in which the at least one radially extending guide flange is received, the at least one slot delimiting axial and rotational movement of the actuator. The at least one slot can be L-shape having a first portion of the L-shape extending axially and a second portion of the L-shape extending circumferentially. A biasing element can be interposed between the at least one guide flange and the cylindrical portion of the support, the biasing element urging the actuator axially towards to unlocked position. The bracket can be secured to the circuit board adjacent an edge thereof, and the actuator can be coextensive with the circuit board in a direction perpendicular to the bracket.

In accordance with another aspect, a method of securing a first device of an I/O system to a second device of an I/O system comprises coupling the first device to the second device, and locking the first device to the second device with a locking actuator assembly. The locking actuator assembly includes an actuator supported for axial and rotational movement by a circuit board of the first device, the actuator movable from an unlocked position to a locked position upon axial depression and rotation of a first end of the actuator, wherein a second end of the actuator includes at least one flange adapted to pass through a corresponding slot in a surface of the second device such that when the actuator is rotated the at least one flange restricts withdrawal of the actuator from the slot/opening in the surface of the second device. Locking the first device to the second device can include depressing and rotating the first end of the actuator from an external side of the first device opposite the second device.

BRIEF DESCRIPTION OF THE DRAWINGS

FIG. 3A is a perspective cross-sectional view of a plurality of I/O modules connected to an I/O base;

FIG. 7 is a perspective view of an exemplary locking actuator assembly in accordance with the present disclosure;

FIG. 8 is a perspective view of an actuator of a locking actuator assembly in accordance with the present disclosure;

FIG. 11 is a cutaway perspective view of another exemplary I/O module having a locking actuator assembly in accordance with the present disclosure.

DETAILED DESCRIPTION

Figure 1:
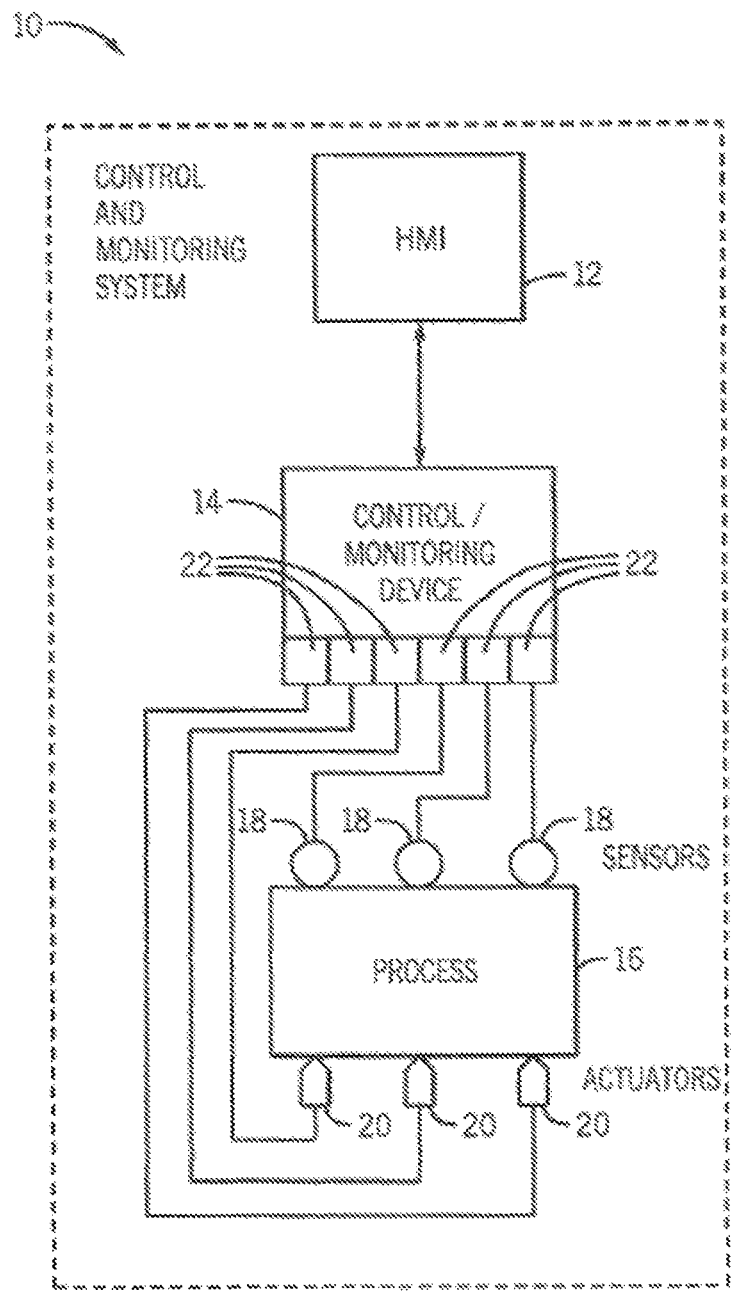
FIG. 1 is a diagrammatical representation of an exemplary control and monitoring system adapted to interface with networked components and configuration equipment.

FIG. 1 is a diagrammatical representation of a control and monitoring system adapted to interface with networked components and configuration equipment in accordance with embodiments of the present techniques. A full description of the system is set forth in commonly-assigned U.S. Pat. No. 9,059,539, issue on Jun. 16, 2015, which is hereby incorporated herein by reference in its entirety.

The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16.

The illustrated process 16 includes sensors 18 and actuators 20. The sensors 18 can include any number of devices adapted to provide information regarding process conditions. The actuators 20 can include any number of devices adapted to perform a mechanical action in response to a signal from a controller (e.g., an automation controller). The sensors 18 and actuators 20 can be utilized to operate process equipment. Indeed, they can be utilized within process loops that are monitored and controlled by the control/monitoring device 14 and/or the HMI 12. Such a process loop can be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 can communicate with the control/monitoring device 14 via one or more I/O devices 22 coupled to the control/monitoring device 14. The I/O devices 22 can transfer input and output signals between the control/monitoring device 14 and the controlled process 16. The I/O devices 22 can be integrated with the control/monitoring device 14, or can be added or removed via expansion slots, bays or other suitable mechanisms. For example, additional I/O devices 22 can be added to add functionality to the control/monitoring device 14.

The I/O devices 22 can include input modules that receive signals from input devices such as photo-sensors and proximity switches, output modules that use output signals to energize relays or to start motors, and bidirectional I/O modules, such as motion control modules which can direct motion devices and receive position or speed feedback. In some arrangements, the I/O devices 22 can convert between AC and DC analog signals used by devices on a controlled machine or process and DC logic signals used by the control/monitoring device 14.

Figure 2:
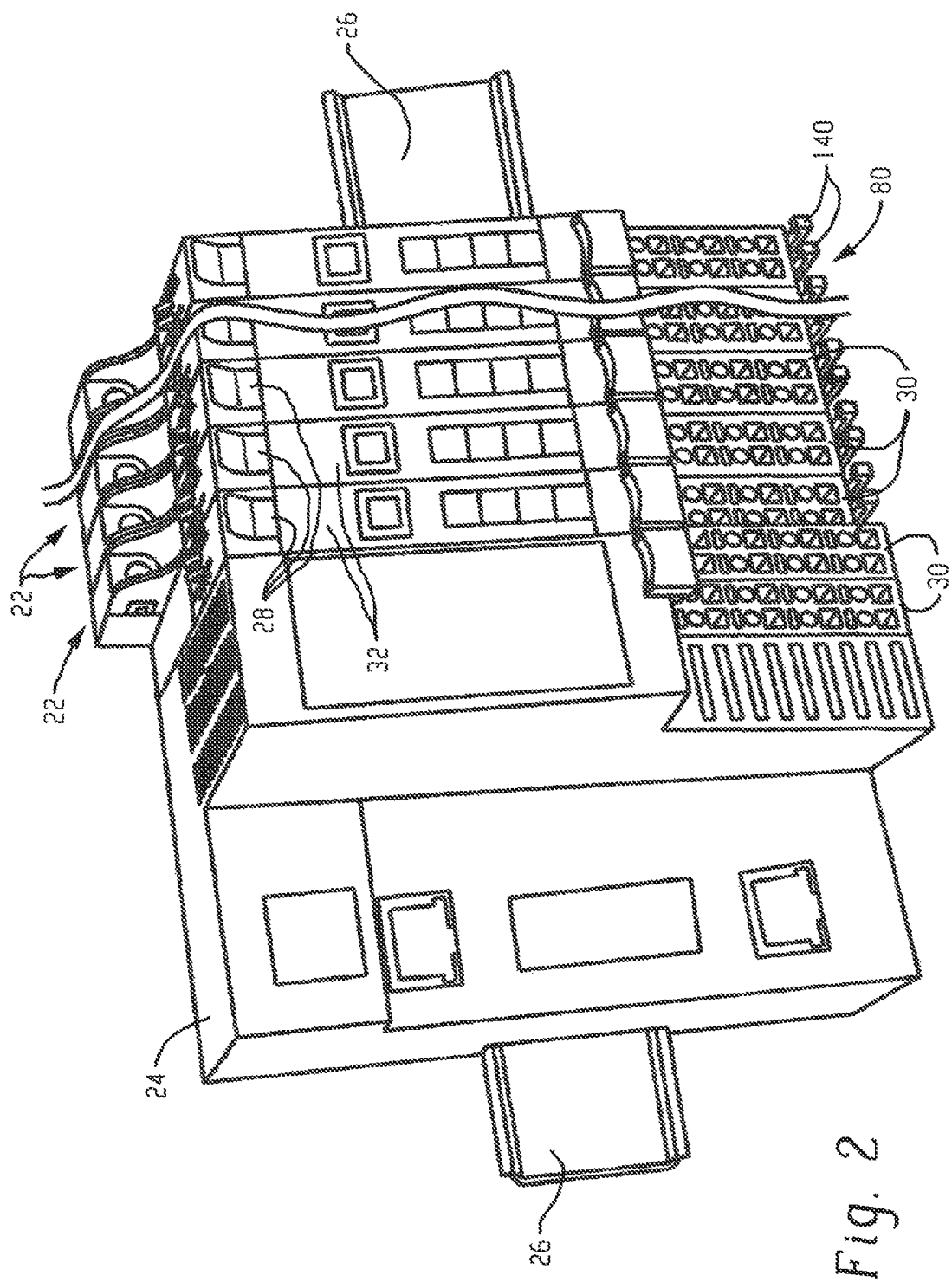
FIG. 2 is a perspective view of a plurality of I/O devices connected to an I/O adapter.

FIG. 2 is a perspective view of a plurality of I/O devices 22 connected to an I/O adapter 24 in accordance with embodiments of the present techniques. The I/O adapter 24 is configured to provide system power to the I/O modules 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. The plurality of I/O devices 22 are electrically coupled in series along the DIN rail 26 such that field power and system information and power may be communicated between the I/O devices 22, and back through the I/O adapter 24 to the control/monitoring device 14.

Each of the I/O devices 22 includes a base 28 for physically and communicatively connecting the I/O device 22 to the DIN rail 26, the I/O adapter 24 and/or adjacent I/O devices 22, a terminal block 30, and one or more I/O modules 32. The terminal block 30 may be used to electrically connect the I/O device 22 to field devices, such as the sensors 18 and actuators 20 illustrated in FIG. 1. In certain arrangements, the terminal block 30 can be removable from the base 28. The I/O modules 32 may include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth.

Figure 3B:
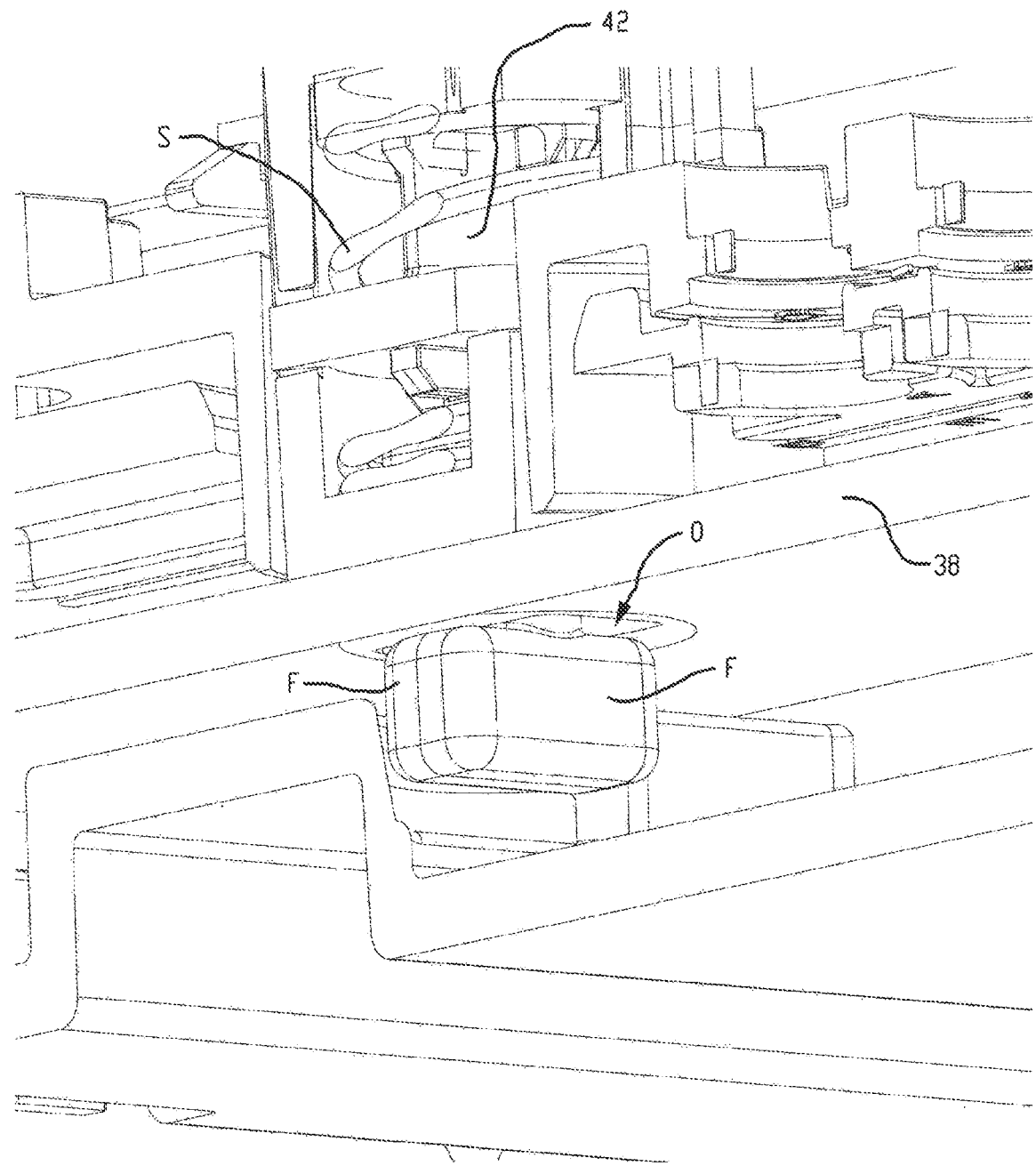
FIG. 3B is an enlarged perspective view of a locking actuator assembly of an I/O module in a locked configuration.

With reference to FIGS. 3A and 3B, an exemplary I/O system is illustrated and identified generally by reference numeral 10'. It should be appreciated that the I/O system 10' generally includes many of the same components, features and functionality of the I/O system 10 shown and described in connection with FIGS. 1 and 2. These components include, generally, an I/O base 24' mountable to a DIN rail (not shown) and having a base circuit board 38 with a plurality of connectors C1, a plurality of I/O devices 22' each including an I/O module 32' mounted to the base 24' and a terminal block 30'. Each I/O module 32' includes a connector C2 adapted for mating with a respective connector C1 of the I/O base 24'.

Figure 4:
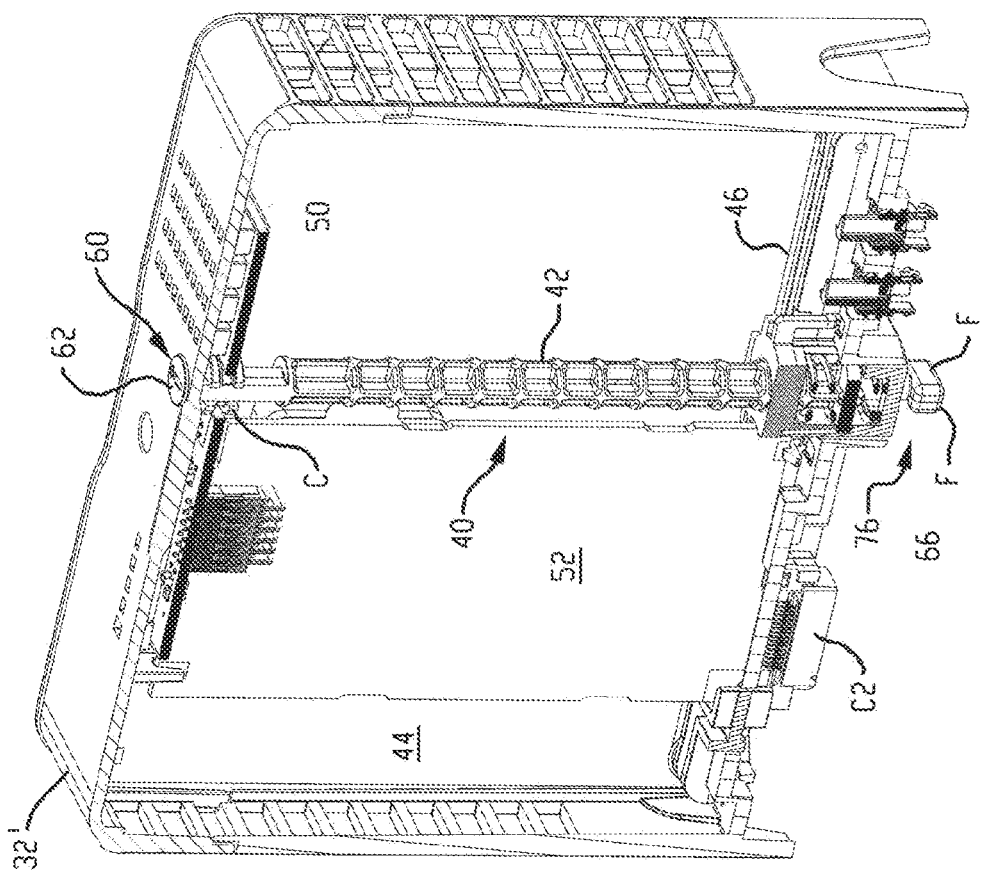
FIG. 4 is a cutaway view of an exemplary I/O module with a locking actuator assembly in an unlocked state.

In accordance with the present disclosure, each I/O module 32' includes a locking actuator assembly 40 for securing the I/O module 32' to the base 24'. With additional reference to FIGS. 4 and 5, the locking actuator assembly 40 generally includes a spring-loaded actuator 42 supported for rotational and reciprocating movement within a housing 44 of the I/O module 32' by a collar C and a bracket 46. Collar C in the illustrated embodiment is supported in an LED circuit board 50 of the I/O module 32'. Bracket 46 is secured to a main circuit board 52 of the I/O module 32' adjacent connector component C2 of the I/O module 32'. The actuator 110 actuator 42 is movable from a first, unlocked position, shown in FIG. 4 to a second, locked position shown in FIG. 5.

Figure 5:
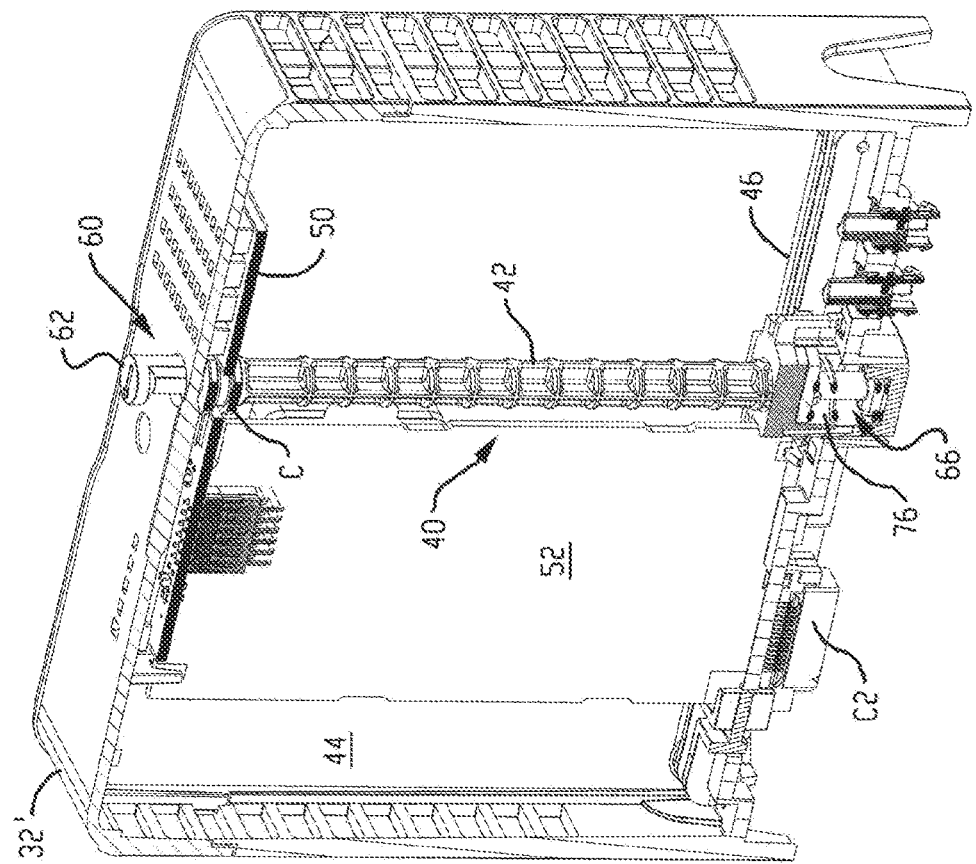
FIG. 5 is a cutaway view of an exemplary I/O module with a locking actuator assembly in a locked state.

A first end 60 of the actuator 42 includes a slot 62 for engagement with a tool, such as a screwdriver, for depressing and rotating the actuator 42. It will be appreciated that other arrangements for facilitating depression and rotation of the actuator 42 can be employed without departing from the scope of the present disclosure, such as hex or torx arrangements, knobs etc. An opposite end 66 of the actuator 42 includes radially outwardly extending flanges F giving the actuator 42 a T-shape cross-section. The end 66 of the actuator 42 protrudes beyond the housing 44 when the actuator 42 is in the locked position, as best seen in FIG. 5.

Figure 6:
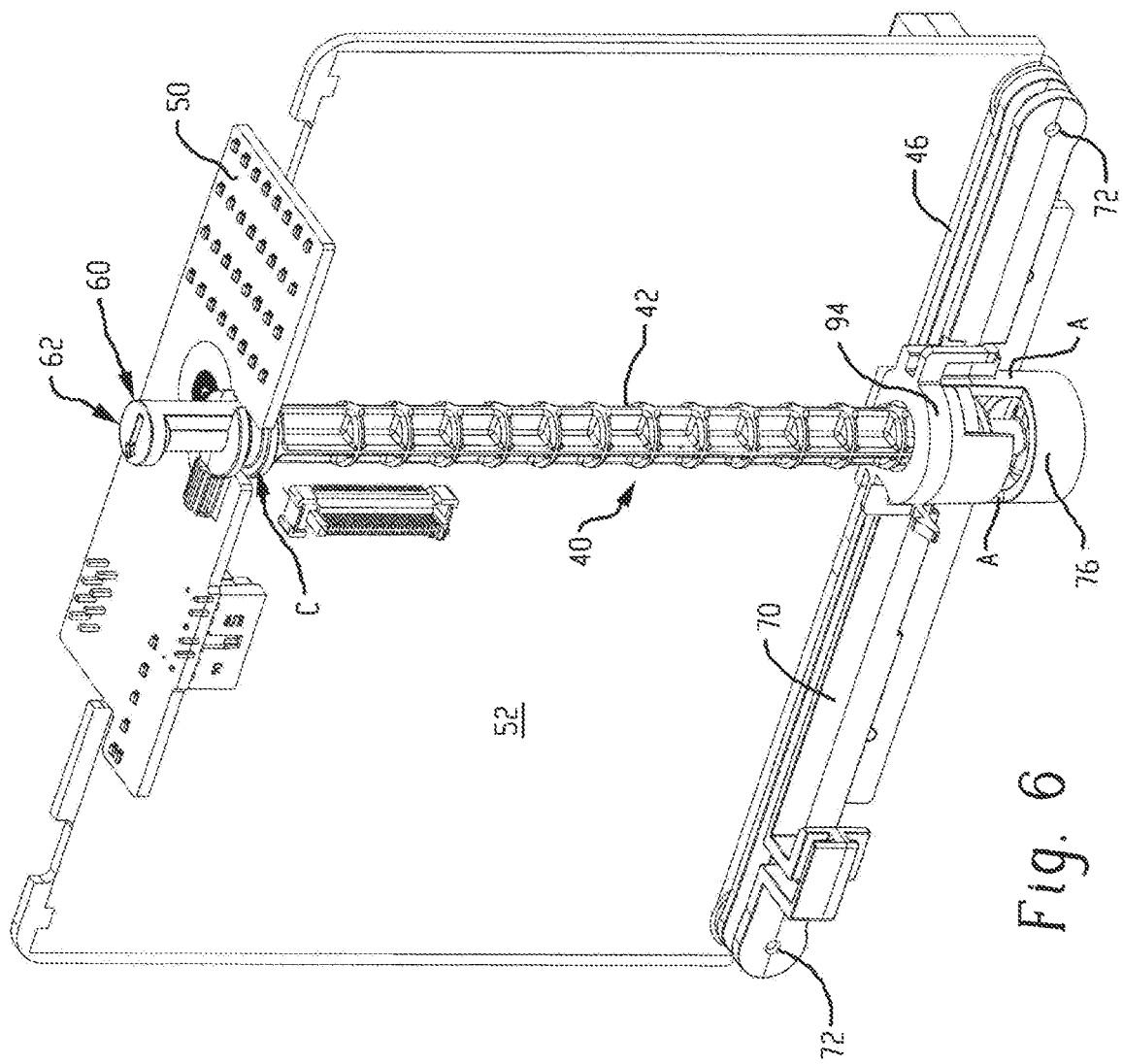
FIG. 6 is a perspective view of a circuit board of an exemplary I/O module including a locking actuator assembly.

Turning to FIG. 6, the locking actuator assembly 40 is shown isolated from the housing 44 of the I/O module 32'. The collar C is received in a slot in the LED circuit board 50 and supports the actuator 42 for rotational and reciprocating movement at a location adjacent the first end 60 of the actuator 42. The bracket 46 includes a longitudinally extending support 70 secured to the main circuit board 52 with fasteners 72, such as pins, screws, adhesive etc., at outboard locations of the main circuit board 42 immediately adjacent a lower terminal edge of the circuit board 52. In the illustrated embodiment, the bracket 46 is not attached to the circuit board 52 between the fasteners 72 thereby maintaining a major portion of the circuit board 52 available for surface mount components and the like. The bracket 46 spans a major portion of the circuit board 52 between the fasteners 72.

With additional reference to FIGS. 7 and 8, the bracket 46 includes a barrel portion 76 through which the second end 66 of the actuator 42 extends. The barrel portion 76 includes opposite axially extending arms A that extend from the support 70 and a cylindrical portion 78 extending from the arms A.

As best seen in FIG. 8, the actuator 42 includes radially extending flanges 82. The radially extending flanges 82 extend in opposite radial directions and are received in respective L-shape slots 92 formed by portions of the arms A, the cylindrical portion 78 and a cap 94 that is secured to the bracket support 70. The L-shape slots 92 have an axially extending portion AE and a circumferentially extending portion CE. In the illustrated embodiment, the axially extending portion corresponds to the base horizontal portion of the L-shape while the circumferentially extending portion corresponds to the vertical portion of the L-shape.

Flanges 82 of the actuator 42 are captured between the barrel portion 76 of the bracket 46 and the cap 94, and a biasing element in the form of a coil spring S (see FIG. 3B) biases the actuator 42 upwardly towards the unlocked position. The spring S is received in the cylindrical portion 78 of the barrel portion 76 and urges the flanges 82 of the actuator 42 upwardly.

It should be appreciated that the flanges 82, being received in the L-shape slots 92 of the bracket 46, restrict both reciprocating and rotational movement of the actuator 42. In FIG. 7, the actuator 42 is shown depressed against the biasing force of the spring S. Further depression of the actuator 42 is restricted by the flanges 82 impinging on a circumferential end wall of the cylindrical portion 78 of the barrel portion 76. Counterclockwise rotation of the actuator 42 is also restricted by the flanges 82 impinging on the arms A. From the position illustrated in FIG. 7, the actuator 42 is free to travel upwardly in FIG. 7 to an undepressed position, corresponding to an unlocked position, limited by impingement of the flanges 82 on a circumferential end face of the cap 94, and free to rotate clockwise to the left in FIG. 7 to a locked position. When rotated to the locked position, the flanges 82 are trapped in the circumferentially extending portion CE of the slots 92 and thereby the actuator 42 is restricted from axial movement.

It will now be appreciated that the I/O module 32' can be secured to the base 24' after engagement of the connector component C2 of the I/O module 32' with the connector component C1 of the base 24' by depressing end 60 of the actuator and then rotating the actuator clockwise 90 degrees.

Returning to FIG. 3B, when the actuator 42 is in the unlocked position, the flanges F of the end 62 of the actuator are aligned with a correspondingly-shaped opening O in the circuit board 38 of the base 24'. When the actuator 42 is depressed, the flanges F of the end 66 of the actuator 42 pass through the opening O to a position below the circuit board 38. Rotation of the actuator 42 ninety degrees results in the flanges F no longer being aligned with the opening O in the circuit board 38. Accordingly, as the spring urges the actuator 42 upwardly, the flanges F engage an opposite side of the circuit board 38 surrounding the opening O. Thus, the spring force of the spring S holds the I/O module 32' and, more directly, the circuit board 52 of the I/O module 32', against the circuit board 38 base 24'.

It should be appreciated that springs having various spring constants can be employed to apply a wide range of holding forces. In some embodiments, the spring S can be omitted. In many applications, however, the spring-loaded actuator is desirable for accommodating tolerance stack-up in the various components of the I/O system and/or the locking actuator assembly 40.

It should also be appreciated that the locking actuator assembly 40 of the present disclosure locates the interlocking features (e.g., flanges F and opening O) in close proximity to the connector components C1 and C2 of the I/O module 32' and base 24'. This results in a more compact force path between the interlocked components. For example, the actuator 42 engages the circuit board 38 of the base 24' in close proximity to the attachment points/fasteners 72 of the support 46 to the main circuit board 52. As such, a major portion of the actuator 42 is not under load in the locked position, the forces instead being transferred from the flanges F to the flanges 82 through spring S to barrel portion 78 and to the main circuit board 52 via the support 46. However, the actuator 42 remains conveniently accessible from an outer surface of the I/O module 32', and also provides a visual indication of the status (e.g., locked or unlocked) of the locking actuator assembly (e.g., the actuator end 60 is proud of the housing 46 when unlocked, and flush with the housing 46 when locked). Interlocking the circuit boards 38 and 52 in close proximity to the connector pair achieves a more reliable connection between the connector pairs, and eliminates any tolerance stack-up that would result from interlocking, for example, the housings of an I/O module and I/O base.

As shown best in FIG. 8, the L-shape slots 92 limit the travel of the actuator 42 axially and rotationally. As such, actuator point of failure can be designed into the actuator 42 for situations where excessive force is applied to the actuator 42. Such points of failure include, but are not limited to, the screwdriver slot 62, the flanges 82, and/or the shaft of the actuator 42.

Figure 10:
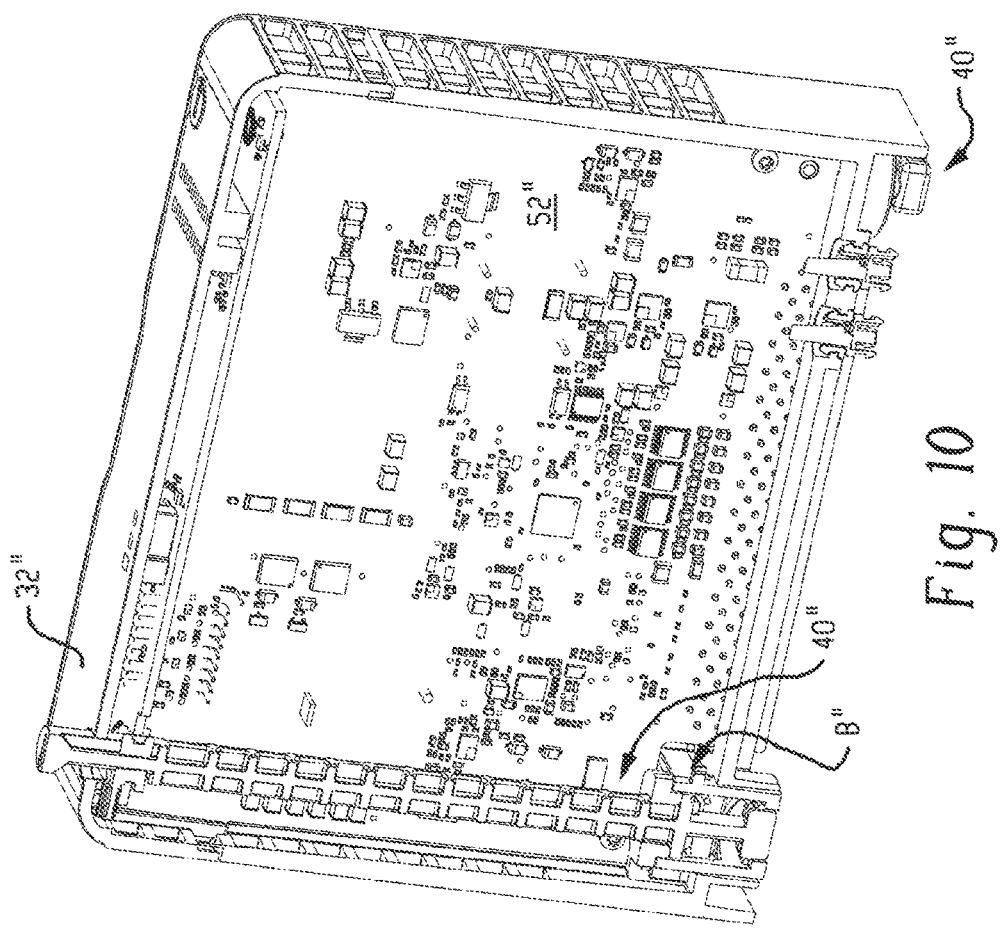
FIG. 10 is another cutaway perspective view of the I/O module of FIG. 9.
Figure 9:
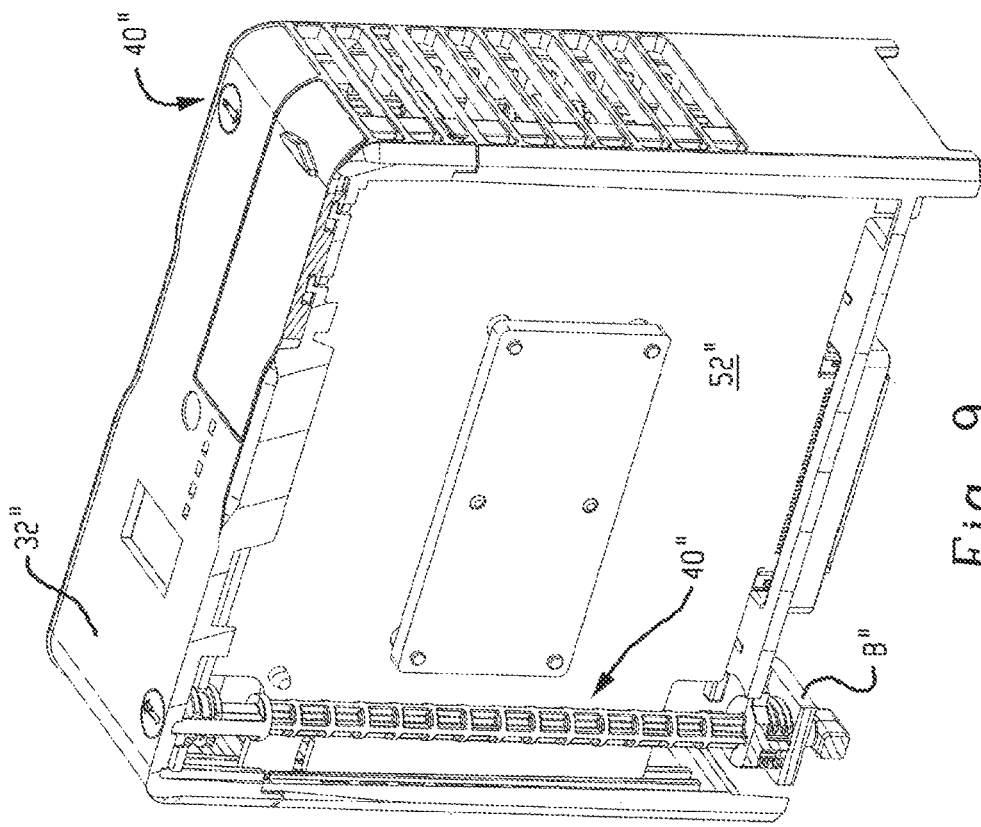
FIG. 9 is a cutaway perspective view of an exemplary I/O module having first and second locking actuator assemblies in accordance with the present disclosure.

Turning to FIGS. 9 and 10, another exemplary embodiment of an I/O in accordance with the present disclosure is illustrated and identified generally by reference numeral 32". In this embodiment, two locking actuator assemblies 40" are provided at opposite corners of the I/O module 24". The locking actuator assemblies 40" are similar to the locking actuator assembly 40 of FIGS. 3-8, with the exception that the support 46 is omitted in the locking actuators 40". Instead, the locking actuator assemblies 40" are mounted directly to the main circuit board 52" via bracket B".

FIG. 11 illustrates another exemplary embodiment of an I/O module 32''' in accordance with the present disclosure. In this example, a locking actuator assembly 40''' is fixed directly to a main circuit board 52''' via bracket B'.

It should be appreciated that the form and function of the locking actuator assemblies 40" and 40''' are the same as locking actuator assembly 40 described in detail above except for the structure attaching them to the circuit boards.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The following is claimed:

1. An I/O system comprising:
   an I/O base having a first connector component located on a base circuit board;
   an I/O module selectively attachable to the I/O base and having a main circuit board including a second connector component adapted to mate with the first connector component; and
   a locking actuator assembly for securing the I/O module to the I/O base, said locking actuator assembly comprising:
   a bracket secured to the main circuit board within the I/O module adjacent the second connector component, said bracket comprising a longitudinally extending support comprising first and second ends secured to said main circuit board at respective outboard locations such that said support of said bracket spans said main circuit board adjacent said second connector component between said outboard locations, said support further comprising a cylindrical portion comprising an L-shaped slot including an axially extending slot portion and a circumferentially extending slot portion;
   an actuator that extends through said cylindrical portion of said bracket support and supported for axial and rotational movement by relative to said bracket, the actuator movable from an unlocked position having a first end of the actuator extending from a housing of the I/O module to a locked position wherein a second end of the actuator extends from the housing, the second end of the actuator including at least one flange adapted to engage a corresponding surface of the I/O base when the actuator is rotated in said locked position such that the at least one flange restricts withdrawal separations of the I/O module from the I/O base;
   a spring operably engaged between said actuator and said support and biasing said actuator axially outward toward said unlocked position;
   said actuator comprising a radially extending guide flange located in said L-shaped slot such that said actuator is axially movable but not rotatably movable relative to said support when said guide flange is located in said axially extending portion of said L-shaped slot and is radially movable but not axially movable relative to said support when said guide flange is located in said circumferentially extending portion of said L-shaped slot.

2. The I/O system of claim 1, further comprising a cap secured to the support and engaged with the cylindrical portion, the cylindrical portion of the support and the cap defining a cavity in which at least one radially extending guide flange of the actuator is located.

3. The I/O system of claim 2, wherein the cap and the cylindrical portion define said L-shaped slot in which the at least one guide flange is received.

4. The I/O system of claim 3, wherein the I/O module housing comprises a first exterior side and an opposite second exterior side, and wherein the first end of the actuator extends from the first exterior side of the housing of the I/O device when in the unlocked position, and wherein the second end of the actuator extends from the opposite second exterior side of the housing when in the locked position.

5. The I/O system of claim 4, wherein the support of the bracket is secured to the main circuit board of the I/O module adjacent the second exterior side of the housing.

6. The I/O system of claim 1, wherein:
   the I/O module further comprises a LED circuit board;
   the locking actuator assembly further comprises a collar connected to the LED circuit board; and,
   the actuator is operably engaged with the collar such that said collar supports the actuator for axial and rotational movement relative to said collar and said LED circuit board.

7. A locking actuator assembly for selectively securing together associated first and second devices of an associated I/O system comprising:
   a locking actuator assembly connected to said first associated device, said locking actuator including:
   a bracket comprising a support that extends across a main circuit board between opposite outboard locations on a main circuit board adjacent a lower edge of said main circuit board that includes a connector, said support comprising opposite ends respectively secured to said opposite outboard locations, said support comprising an L-shaped slot;
   an actuator operably movably engaged with said support, the actuator comprising a radially projecting guide flange engaged with and movable within said L-shaped slot of said support such that said actuator is selectively manually movable from an unlocked position to a locked position upon axial depression of a first end of the actuator when said guide flange is located in an axially extending portion of said L-shaped slot followed by rotation of said first end of the actuator when said guide flange is located in a circumferentially extending portion of said L-shaped slot, wherein a second end of the actuator includes at least one flange adapted engage a corresponding surface of the associated second device such that when the actuator is rotated the at least one flange restricts separation of the associated first and second devices.

8. The locking actuator assembly of claim 7, further comprising an LED circuit board located in said first associated device, said locking actuator assembly further comprising a collar secured to said LED circuit board and operably engaged with said actuator to support said actuator for axial and rotational movement relative to said LED circuit board and said main circuit board.

9. The locking actuator assembly of claim 8, wherein the actuator is supported by the support at a location between first and second ends of the support, the first and second ends of the support being respectively secured to the circuit board at said opposite outboard locations thereof such that a major portion of a width of the circuit board is bridged by the support.

10. The locking actuator assembly of claim 9, wherein the support comprises a cylindrical portion and a cap secured to the bracket adjacent the cylindrical portion such that the cylindrical portion and cap define a cavity in which a radially extending guide flange of the actuator is received.

11. The locking actuator assembly of claim 10, wherein the cap and the cylindrical portion define the L-shaped slot in which the at least one radially extending guide flange is received.

12. The locking actuator assembly of claim 11, further comprising a biasing element interposed between the at least one guide flange and the support, the biasing element urging the actuator axially towards to unlocked position.

13. The locking actuator assembly of claim 7, wherein the actuator is coextensive with the circuit board in a direction perpendicular to the support of the bracket.

* * * * *